United States Patent
Kim et al.

(10) Patent No.: US 11,803,223 B2
(45) Date of Patent: Oct. 31, 2023

(54) OPEN CHANNEL SOLID STATE DRIVE, NONVOLATILE MEMORY SYSTEM INCLUDING THE SAME AND METHOD OF POWER LOSS PROTECTION OF OPEN CHANNEL SOLID STATE DRIVE

(71) Applicant: SAMSUNG ELECTRONICS CO., LTD., Suwon-si (KR)

(72) Inventors: Dae Ok Kim, Yongin-si (KR); In Hae Kang, Seongnam-si (KR); Min Seok Ko, Seoul (KR); Yang Woo Roh, Hwaseong-si (KR); In Hwan Doh, Seoul (KR); Jong Won Lee, Seoul (KR); Se Jeong Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/473,522

(22) Filed: Sep. 13, 2021

(65) Prior Publication Data

US 2021/0405724 A1    Dec. 30, 2021

Related U.S. Application Data

(63) Continuation of application No. 16/588,179, filed on Sep. 30, 2019, now Pat. No. 11,126,238.

(30) Foreign Application Priority Data

Dec. 5, 2018    (KR) ........................ 10-2018-0155182

(51) Int. Cl.
*G06F 3/06* (2006.01)
*G06F 12/02* (2006.01)
*G06F 1/30* (2006.01)

(52) U.S. Cl.
CPC .............. *G06F 1/305* (2013.01); *G06F 3/064* (2013.01); *G06F 3/0617* (2013.01); *G06F 3/0688* (2013.01); *G06F 12/0246* (2013.01)

(58) Field of Classification Search
CPC ........ G06F 1/30; G06F 1/305; G06F 11/2015; G06F 12/0246; G06F 2212/1032;
(Continued)

(56) References Cited

U.S. PATENT DOCUMENTS

| 8,909,986 B2 | 12/2014 | Huang et al. |
| 9,448,919 B1 | 9/2016 | Boyle |

(Continued)

FOREIGN PATENT DOCUMENTS

| KR | 10-2015-0039000 | 4/2015 |
| KR | 10-2016-0110596 | 9/2016 |
| KR | 10-2018-0035271 | 4/2018 |

OTHER PUBLICATIONS

Extended European Search Report in Corresponding European Application No. EP19213230.6.

(Continued)

*Primary Examiner* — Jane W Benner
(74) *Attorney, Agent, or Firm* — F. Chau & Associates, LLC

(57) ABSTRACT

An open channel solid state drive includes a flash memory including a first block and a controller which controls the flash memory, the controller receiving write data and a physical address of the first block from a host and attempting a write of the data in the first block. The controller generates first data which is not written in the first block among the write data when a power-off occurs during writing attempt. The write data includes the first data and second data already written in the first block. The controller determines whether successive writing of the first data in the first block is (Continued)

possible or impossible. If the successive writing is possible, the controller successively writes the data in the first block. If the successive writing is impossible, the host or the controller writes the first data and the second data in a second block of the flash memory.

16 Claims, 13 Drawing Sheets

(58) Field of Classification Search
CPC ...... G06F 3/0619; G06F 3/064; G06F 3/0679; G06F 3/0688; G06F 3/0617; G06F 3/062; G06F 3/0631; G06F 3/0647; G06F 3/0653; G06F 3/0658; G11C 16/10; G11C 16/16; G11C 16/22; G11C 16/30; G11C 16/32; G11C 16/3459; G11C 5/143; G11C 14/00
See application file for complete search history.

(56) References Cited

U.S. PATENT DOCUMENTS

| | | |
|---|---|---|
| 9,645,894 B2 | 5/2017 | Lin et al. |
| 9,940,045 B2 | 4/2018 | Park |
| 9,996,462 B1 | 6/2018 | Lin |
| 2009/0150600 A1 | 6/2009 | Suda |
| 2010/0106893 A1* | 4/2010 | Fasoli ................. G11C 16/102 711/E12.078 |
| 2010/0142275 A1* | 6/2010 | Yogev .................... G11C 29/76 711/E12.008 |
| 2013/0219107 A1* | 8/2013 | Lee ..................... G11C 11/5628 711/E12.008 |
| 2014/0310448 A1 | 10/2014 | Nam et al. |
| 2017/0228154 A1 | 8/2017 | Liu et al. |
| 2018/0088841 A1 | 3/2018 | Ma et al. |
| 2018/0101302 A1* | 4/2018 | Lin .................... G06F 12/0246 |
| 2018/0129453 A1 | 5/2018 | Kim |
| 2018/0181460 A1 | 6/2018 | Hong |
| 2018/0336960 A1* | 11/2018 | Chu .................... G06F 11/3034 |
| 2019/0196955 A1 | 6/2019 | Chang et al. |
| 2020/0081832 A1 | 3/2020 | Hsu et al. |
| 2020/0183474 A1 | 6/2020 | Kim et al. |

OTHER PUBLICATIONS

Office Action dated Mar. 2, 2021 in corresponding U.S. Appl. No. 16/588,179.

* cited by examiner

OPEN CHANNEL SOLID STATE DRIVE, NONVOLATILE MEMORY SYSTEM INCLUDING THE SAME AND METHOD OF POWER LOSS PROTECTION OF OPEN CHANNEL SOLID STATE DRIVE

CROSS-REFERENCE TO RELATED APPLICATION

This U.S. non-provisional patent application is a continuation of U.S. patent application Ser. No. 16/588,179 filed Sep. 30, 2019, claims priority under 35 U.S.C. § 119 to Korean Patent Application No. 10-2018-0155182, filed on Dec. 5, 2018 in the Korean Intellectual Property Office, the disclosures of which are incorporated by reference in their entirety herein.

BACKGROUND

1. Technical Field

The present disclosure relates to an open channel solid state drive, a nonvolatile memory system including the same, and a method of power loss protection of the open channel solid state drive.

2. Discussion of Related Art

A typical example of a data storage device based on a flash memory device is a solid state drive. Interfaces used for a solid state drive may include Serial ATA (SATA), Peripheral Component Interconnect Express (PCIe), and Serial Attached SCSI (SAS).

The solid state drive includes general solid state drives and open channel solid state drives. The general solid state drive includes a flash translation layer in a solid state drive and receives a command based on a logical address from a host. Since the open channel solid state drive does not include the flash translation layer in the solid state drive, the open channel solid state drive receives a command based on a physical address from the host. Different from the host of the general solid state drive, the host of the open channel solid state drive includes the flash translation layer and directly manages the physical address of the open channel solid state drive in which the data is stored.

SUMMARY

At least one exemplary embodiment of the present inventive concept provides an open channel solid state drive having a power loss protection (PLP) technique.

At least one exemplary embodiment of the present inventive concept also provide a nonvolatile memory device including the open channel solid state drive having the power loss protection technique.

At least one exemplary embodiment of the present inventive concept also provides a method of power loss protection of the open channel solid state drive for protecting data being written.

According to an exemplary embodiment of the present inventive concept, there is provided an open channel solid state drive. The open channel solid state drive includes a flash memory including a first block and a controller which controls the flash memory, the controller receiving write data and a physical address of the first block from a host and attempting a write of the data in the first block. The controller generates first data which is not written in the first block among the write data when a power-off occurs during writing attempt. The write data includes the first data and second data already written in the first block. The controller determines whether successive writing of the first data in the first block is possible. If the successive writing is possible, the controller successively writes the data in the first block. If the successive writing is impossible, the host or the controller writes the first data and the second data in a second block of the flash memory.

According to an exemplary embodiment of the present inventive concept, there is provided a nonvolatile memory system. The nonvolatile memory system includes a host, and an open channel solid state drive which receives a command and a physical address from the host. The open channel solid state drive includes a flash memory including a first block, and a controller which controls the flash memory, the controller receiving write data and the physical address of the first block from the host and attempting a write of the write data in the first block. The controller generates first data which is not written in the first block among the data when a power-off occurs during the writing attempt, the write data including the first data and second data already written in the first block. The controller determines whether successive writing of the first data in the first block is possible. If the successive writing is possible, the controller successively writes the data in the first block. If the successive writing is impossible, the host or the controller writes the first data and the second data in a second block of the flash memory.

According to an exemplary embodiment of the present inventive concept, there is provided a nonvolatile memory system. The nonvolatile memory system includes a host, and an open channel solid state drive which receives write data, a command and a physical address from the host. The open channel solid state drive includes a flash memory including a first block, and a controller which controls the flash memory. The controller includes a module which determines whether successive writing of the write data in the first block is possible to generate a possible signal or an impossible signal, when power is turned off while the write data is written in the first block. When the possible signal is generated, the controller performs the successive writing in the first block in response to the possible signal. When the impossible signal is generated, first data which has not yet been written and a second data which has already been written in the first block among the write data are written in a second block of the flash memory.

According to an exemplary embodiment of the present inventive concept, there is provided an open channel solid state drive including a flash memory and a controller. The controller is for receiving write data and a physical address of a first block of the flash memory from a host, and attempting to write the write data to a location of the first block of the flash memory corresponding to the physical address while receiving main power. The controller uses auxiliary power to determine a portion of the write data not written to the first block when the main power is lost, to determine whether the portion can be written to the first block, to write the portion to the first block when it is determined that the portion can be written, and to write the write data to a second block of the flash memory when it is determined that the portion cannot be written.

BRIEF DESCRIPTION OF THE DRAWINGS

The present inventive concept will become more apparent by describing in detail exemplary embodiments thereof with reference to the attached drawings, in which.

DETAILED DESCRIPTION OF THE EXEMPLARY EMBODIMENTS

Hereinafter, an open channel solid state drive, a nonvolatile memory system including an open channel solid state drive, and a method of power loss protection of an open channel solid state drive according to some exemplary embodiments of the present inventive concept will be described with reference to FIGS. 1 to 16.

Figure 1:
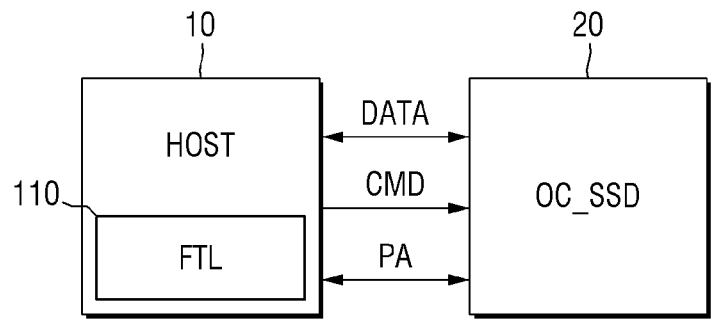
FIG. 1 is a block diagram illustrating a nonvolatile memory system according to an exemplary embodiment of the present inventive concept.

FIG. 1 is a block diagram illustrating a nonvolatile memory system according to an exemplary embodiment of the present inventive concept.

Referring to FIG. 1, the nonvolatile memory system includes a host 10 (e.g., a host device) and an open channel solid state drive 20.

The host 10 may control the overall operation of the open channel solid state drive 20. For example, the host 10 includes a flash translation layer FTL (110). In an embodiment, the flash translation layer 110 performs a mapping of a logical address used in the host 10 to a physical address (PA) of the nonvolatile memory of the open channel solid state drive 20. Therefore, the host 10 may directly manage the physical address of the nonvolatile memory via the flash translation layer 110.

The host 10 may transmit various commands (CMD) to the open channel solid state drive 20. For example, the host 10 may transmit basic commands (CMD) such as a read, a write and an erase. The basic commands (CMD) may be generated on the basis of the physical address (PA) of the nonvolatile memory. In addition, the host 10 may execute management operations of the open channel solid state drive 20, such as data placement, input/output (I/O) scheduling, and background operations. The management operations may also be executed on the basis of the physical address (PA) of the nonvolatile memory.

Figure 2:
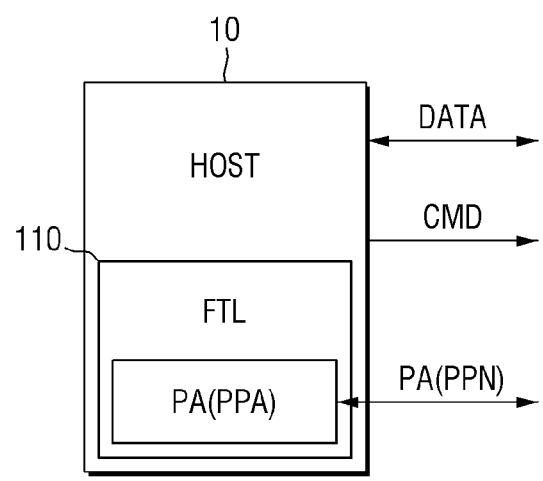
FIG. 2 is a block diagram for explaining a host of FIG. 1 according to an exemplary embodiment of the present inventive concept.

FIG. 2 is a block diagram for explaining the host of FIG. 1 according to an exemplary embodiment of the inventive concept.

Referring to FIG. 2, the flash translation layer 110 of the host 10 may control the physical address (PA) of the nonvolatile memory in the form of a physical page address (PPA). In contrast, the open channel solid state drive 20 of FIG. 1 may control the physical address (PA) with a physical page number (PPN).

In an exemplary embodiment, the physical page address (PPA) and the physical page number (PPN) are substantially the same or exactly the same. However, in some exceptional circumstances, the physical page address (PPA) and the physical page number (PPN) may become different from each other. For example, in order to avoid using a specific address, the physical page number (PPN) actually used corresponds to another physical page address (PPA).

Figure 3:
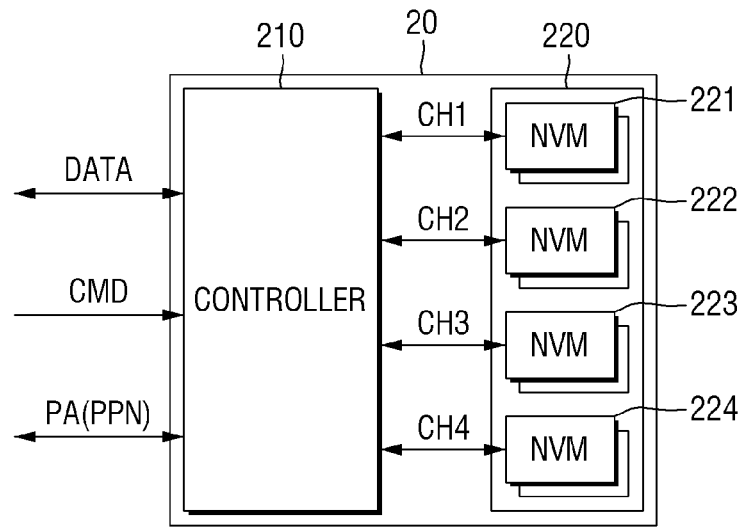
FIG. 3 is a block diagram for explaining an example of the open channel solid state drive of FIG. 1.

FIG. 3 is a block diagram for explaining an example of the open channel solid state drive of FIG. 1.

Referring to FIG. 3, the open channel solid state drive 20 includes a controller 210 (e.g., a control circuit) and a memory 220.

In an exemplary embodiment, the controller 210 and the memory 220 are integrated in a single semiconductor device. As an example, the controller 210 and the memory 220 may be integrated in a single semiconductor device to constitute an open channel solid state drive 20.

Furthermore, the controller 210 and the memory 220 may be integrated in a single semiconductor device to constitute a memory card such as a PC card (PCMCIA: Personal Computer Memory Card International Association), a compact flash card (CF), a smart media card (SM, and SMC), a memory stick, a multimedia card (MMC, RS-MMC, and MMCmicro), a SD Card (SD, miniSD, microSD, and SDHC), or a universal flash storage device (UFS).

Further, as another example, the open channel solid state drive 20 may be a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a portable multimedia player (PMP), a portable game console, a navigation device, a black box, a digital camera, a DMB (digital multimedia broadcasting) player, a 3-dimensional television, a smart television, a digital audio recorder, a digital audio player, a digital picture recorder, a digital picture player, a digital video recorder, a digital video player, a storage constituting a data center, a device capable of transmitting and receiving information in a wireless environment, one of various electronic devices constituting a home network, one of various electronic devices constituting a computer network, one of various electronic devices constituting a telematics network, a radio frequency identification (RFID) device, or one of various components constituting the computing system.

The controller 210 controls the memory 220 in response to a request from the host 10. For example, the controller 210 may provide the data (DATA) read from the memory 220 to the host 10 and may write the data (DATA) provided from the host 10 in the memory 220. To this end, the controller 210 may control operations such as reading, writing, programming, and erasing of the memory 220. To this end, the controller 210 may receive the physical address (PA) in the form of data (DATA), a command (CMD) and a physical page number (PPN) from the host 10, and may transmit the physical address (PA) and data (DATA) in the form of the physical page address (PPA) to the host 10.

The memory 220 may write the data (DATA) on the physical address (PA) of the memory 220 by the command (CMD) received by the controller 210. Further, the data (DATA) already written in the memory 220 may be read and transmitted to the host 10 by the controller 210.

The memory 220 of the open channel solid state drive 20 may include a plurality of nonvolatile memories 221 to 224 connected to each of a plurality of channels CH1 to CH4. Each of the plurality of nonvolatile memories 221 to 224 may include a NAND flash memory.

The controller 210 may be connected to the plurality of nonvolatile memories 221 to 224 via the plurality of channels CH1 to CH4, respectively. In FIG. 3, the number of the above-mentioned channels is illustrated as four, but embodiments of the inventive concept are not limited thereto. The memory 220 of the open channel solid state drive 20 of the nonvolatile memory system according to some embodiments of the present inventive concept may have three or fewer channels, or may have five or more channels.

Specifically, the controller 210 may be connected to the first nonvolatile memory 221 via the first channel CH1 and may be connected to the second nonvolatile memory 222 via the second channel CH2. The controller 210 may be connected to the third nonvolatile memory 223 via the third channel CH3 and may be connected to the fourth nonvolatile memory 224 via the fourth channel CH4.

The controller 210 may operate each of a plurality of memory blocks included in the plurality of nonvolatile memories 221 to 224 in one of a single level cell (SLC) mode, a multi level cell (MLC) mode, and a triple level cell (TLC) mode.

Figure 4:
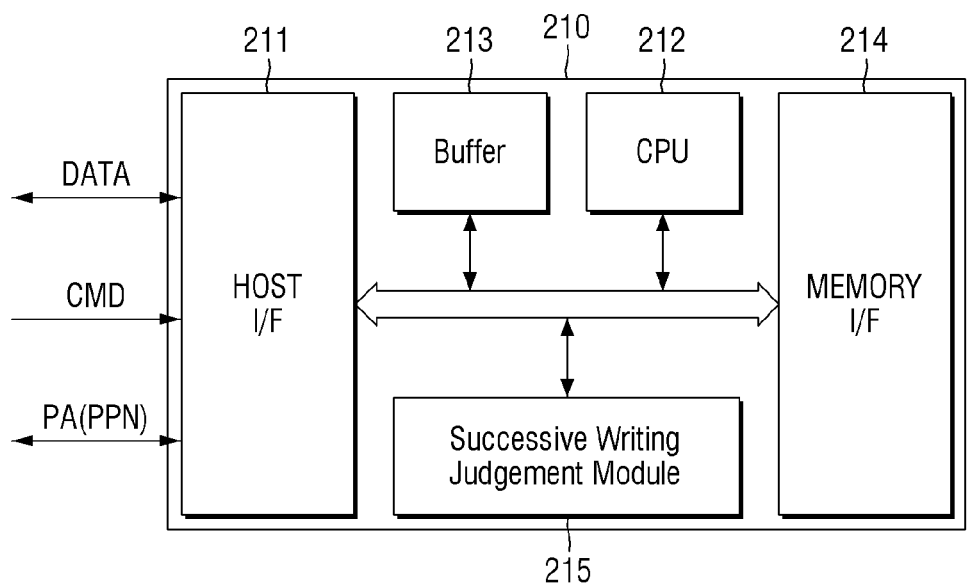
FIG. 4 is a block diagram for explaining a controller of FIG. 3 according to an exemplary embodiment of the present inventive concept.

FIG. 4 is a block diagram for explaining the controller of FIG. 3 according to an exemplary embodiment of the inventive concept.

Referring to FIG. 4, the controller 210 includes a host interface 211 (e.g., an interface circuit), a buffer 213, a central processing unit 212, a successive writing judgement module 215, and a memory interface 214. In an embodiment, the successive writing judgement module 215 is a computer program stored in a memory of the controller 210 that is executed by the central processing unit 212. The computer program may include one or more functions that are executed by the central processing unit 212. In another embodiment, the success writing judgement module 215 is a specialized processor designed to perform the one or more functions.

The host interface 211 may provide an interface with the open channel solid state drive 20 to correspond to the protocol of the host 10. For example, the host interface 211 may communicate with the host 10 by the command (CMD), the physical address (PA), and the data (DATA), using a Universal Serial Bus (USB), a Small Computer System Interface (SCSI), a PCI express, an ATA, a Parallel ATA (PATA), a Serial ATA (SATA), or a Serial Attached SCSI (SAS).

In an exemplary embodiment, the host interface 211 executes a disk emulation function which enables the host 10 to recognize the open channel solid state drive 20 as a hard disk drive (HDD).

The buffer 213 may temporarily store data (DATA) provided from the host 10 and data (DATA) read from the memory 220. In an embodiment, the buffer 213 may include a volatile memory such as a Dynamic Random Access Memory (DRAM), and a Static Random Access Memory (SRAM). In an embodiment, the buffer 213 may be a Tightly-Coupled Memory (TCM).

A central processing unit (CPU) 212 may analyze and process the command (CMD) and the physical address (PA) provided from the host 10. The central processing unit 212 may communicate with the host 10 via the host interface 211 and may control the memory 220 of FIG. 3 via the memory interface 214. The central processing unit 212 may control the operation of the memory 220 using firmware for driving the open channel solid state drive 20.

The memory interface 214 may transfer the data (DATA), which is transferred from the buffer 213, to the memory 220. Also, the memory interface 214 may transfer the data (DATA), which is read from the memory 220, to the buffer 213.

In an embodiment, the memory interface 214 may use a flash memory interface. In this case, the controller 210 may execute a writing operation, a reading operation and an erasing operation in accordance with the flash memory interface.

In an exemplary embodiment, the successive writing judgement module 215 judges whether to write less written data in the same block, that is, whether successive writing is possible, subsequent to the already written data, in a situation in which the power is recovered again for power loss protection, when a sudden power-off occurs during the writing operation. The successive writing judgement module 215 may generate a possible signal if the successive writing is possible, and may generate an impossible signal if the successive writing is impossible. This will be explained in more detail below.

In an embodiment, the successive writing judgement module 215 extracts information, using the central processing unit 212, the host interface 211, the buffer 213 and the memory interface 214, receives a request, and executes a computation. That is, the operation of the successive writing judgement module 215 which will be described below may be an operation associated with the central processing unit 212, the host interface 211, the buffer 213 and the memory interface 214 in a multiple manner.

Figure 5:
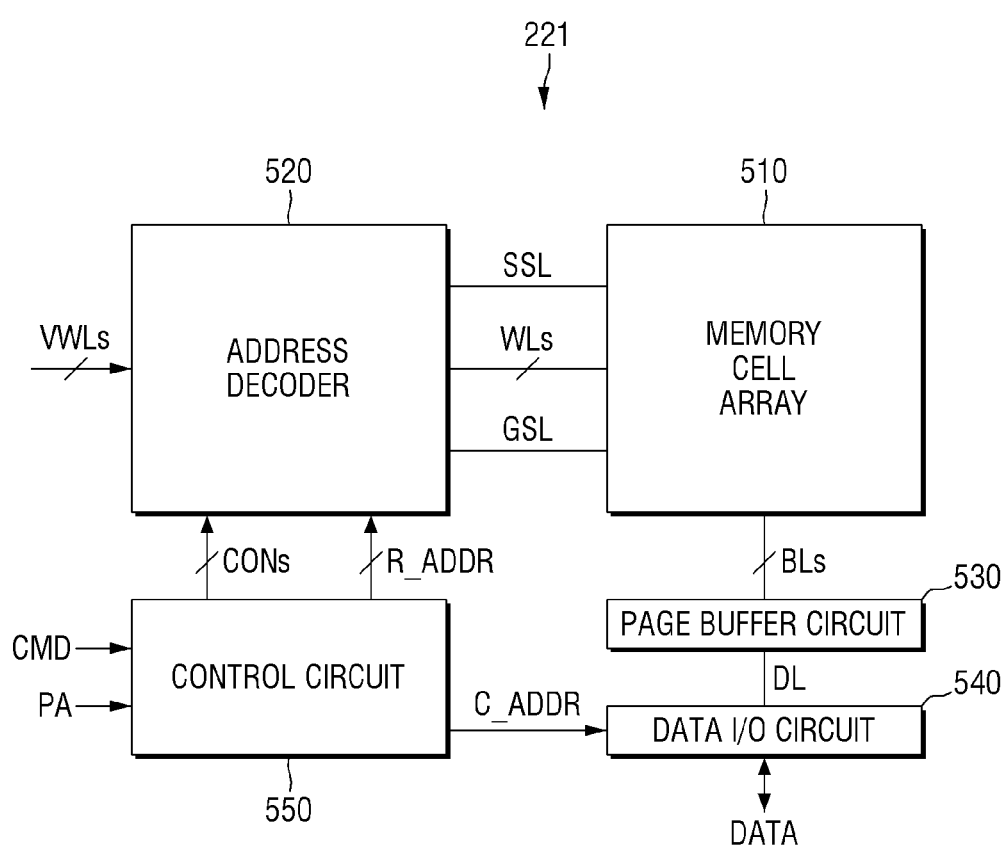
FIG. 5 is a block diagram for explaining a structure of the nonvolatile memory of FIG. 3 according to an exemplary embodiment of the present inventive concept.

FIG. 5 is a block diagram for explaining the structure of the nonvolatile memory of FIG. 3 according to an exemplary embodiment of the inventive concept.

Referring to FIG. 5, the first to fourth nonvolatile memories 221 to 224 of FIG. 3 may be implemented like the first nonvolatile memory 221 of FIG. 5, respectively.

The first nonvolatile memory 221 includes a memory cell array 510, an address decoder 520 (e.g., a decoder circuit), a page buffer circuit 530, a data input/output circuit 540 and a control circuit 550.

The memory cell array 510 may be connected to the address decoder 520 via a string selection line SSL, a plurality of word lines WLs and a ground selection line GSL. Also, the memory cell array 510 may be connected to the page buffer circuit 530 via a plurality of bit lines BLs.

The memory cell array 510 includes a plurality of memory blocks, and each of the plurality of memory blocks includes a plurality of memory cells connected to a plurality of word lines WLs and a plurality of bit lines BLs.

In an embodiment, the memory cell array 510 is a three-dimensional memory cell array formed in a three dimensional structure (or a vertical structure) on a substrate. In this case, the memory cell array 510 may include vertical memory cell strings including a plurality of memory cells formed by being stacked on each other.

In another embodiment, the memory cell array 510 is a two-dimensional memory cell array formed on the substrate in a two-dimensional structure (or a horizontal structure).

Figure 6:
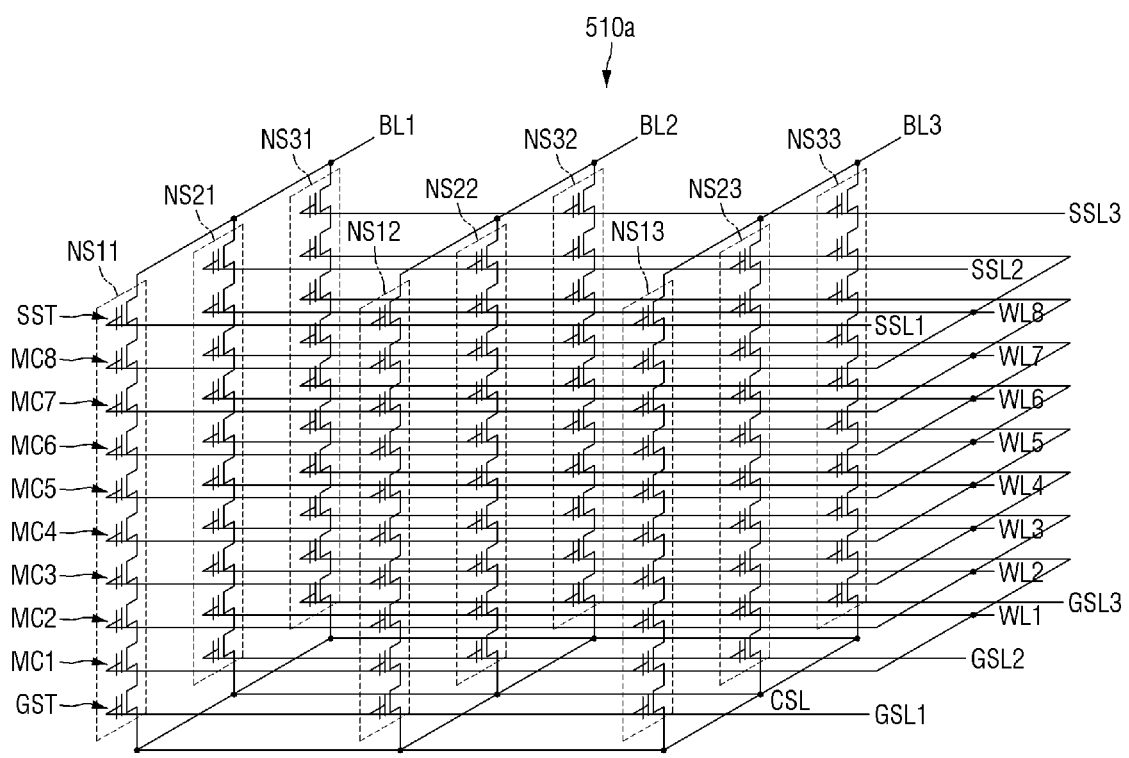
FIG. 6 is an exemplary equivalent circuit diagram for explaining the memory cell array of FIG. 5 according to an exemplary embodiment of the present inventive concept.

FIG. 6 is an exemplary equivalent circuit diagram for explaining the memory cell array of FIG. 5 according to an exemplary embodiment of the inventive concept.

A memory cell array 510a of FIG. 6 may correspond to the memory cell array 510 of FIG. 5. The memory cell array 510a illustrated in FIG. 6 illustrates a three-dimensional memory cell array formed on a substrate in a three-dimensional structure. For example, a plurality of memory cell strings included in the memory cell array 510a may be formed in a direction perpendicular to the substrate.

Referring to FIG. 6, the memory cell array 510 includes a plurality of memory cell strings NS11 to NS33 connected between the bit lines BL1, BL2 and BL3 and the common source line CSL. Each of the plurality of memory cell strings NS11 to NS33 may include a string selection transistor SST, a plurality of memory cells MC1, MC2, . . . , MC8 and a ground selection transistor GST.

In FIG. 6, each of the plurality of memory cell strings NS11 to NS33 is illustrated as including eight memory cells MC1, MC2, . . . , MC8, but embodiments of the inventive concept are not limited thereto.

The string selection transistor SST may be connected to a corresponding one of the string selection lines SSL1, SSL2, and SSL3. Each of a plurality of memory cells MC1, MC2, . . . , MC8 may be connected to corresponding word lines WL1, WL2, . . . , WL8. The ground selection transistor GST may be connected to a corresponding one of the ground selection lines GSL1, GSL2, and GSL3. The string selection transistor SST may be connected to a corresponding one of the bit lines BL1, BL2 and BL3, and the ground selection transistor GST may be connected to the common source line CSL.

The word lines (e.g., WL1) of the same height are commonly connected, and the ground selection lines GSL1, GSL2 and GSL3 and the string selection lines SSL1, SSL2, SSL3 may be separated from each other.

Although FIG. 6 illustrates that the memory cell array 510a is connected to eight word lines WL1, WL2, . . . , WL8 and three bit lines BL1, BL2 and BL3, embodiments of the inventive concept are not limited thereto.

Figure 7:
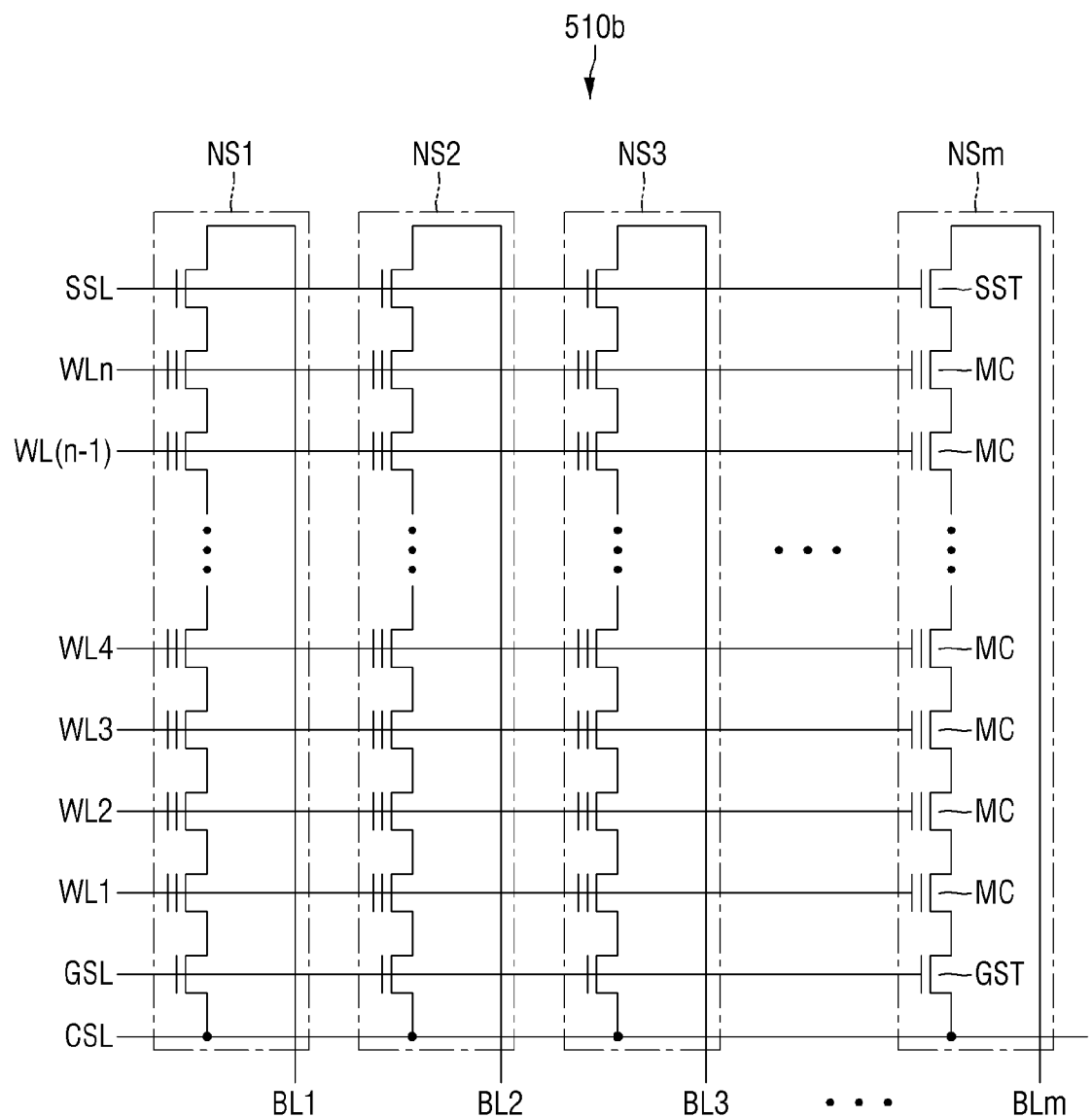
FIG. 7 is an exemplary equivalent circuit diagram for explaining the memory cell array of FIG. 5 according to an exemplary embodiment of the present inventive concept.

FIG. 7 is an exemplary equivalent circuit diagram for explaining the memory cell array of FIG. 5 according to an exemplary embodiment of the inventive concept.

The memory cell array 510b of FIG. 7 may correspond to the memory cell array 510 of FIG. 5. The memory cell array 510b illustrated in FIG. 7 illustrates a two-dimensional memory cell array formed on the substrate in a two-dimensional structure. For example, a plurality of memory cell strings included in the memory cell array 510b may be formed in a direction horizontal to the substrate.

Referring to FIG. 7, the memory cell array 510b includes a plurality of memory cell strings NS1, NS2, NS3, . . . , NSm.

Each of the plurality of memory cell strings NS1, NS2, NS3, . . . , NSm may include a string selection transistor SST, a plurality of memory cells MC and a ground selection transistor GST connected in series to each other.

The string selection transistor SST included in the plurality of memory cell strings NS1, NS2, NS3, . . . , NSm may be commonly connected to the string selection line SSL. Memory cells formed in the same row among a plurality of memory cells MC included in the plurality of memory cell strings NS1, NS2, NS3, . . . , NSm may be commonly connected to corresponding word lines WL1, WL2, WL3, WL4, . . . , WL(n−1), and WLn. The ground selection transistor GST included in the plurality of memory cell strings NS1, NS2, NS3, . . . , NSm may be commonly connected to the ground selection line GSL.

The ground selection transistors GST included in the plurality of memory cell strings NS1, NS2, NS3, . . . , NSm may be commonly connected to the common source line CSL.

The string selection transistor SST included in the plurality of memory cell strings NS1, NS2, NS3, . . . , NSm may be connected to the corresponding bit lines BL1, BL2 and BL3, . . . , BLm.

Here, n and m each represent a positive integer.

Referring back to FIG. 5, the control circuit 550 receives the command (CMD) and the physical address (PA) from the controller 210, and may control the writing operation, the reading operation and the erasing operation of the nonvolatile memory 221 on the basis of the command (CMD) and the physical address (PA).

For example, the control circuit 550 may generate control signals CONs on the basis of the command (CMD) and may generate a row address R_ADDR and a column address C_ADDR on the basis of the physical address (PA). The control circuit 550 may provide the control signals CONs and the row address R_ADDR to the address decoder 520 and may provide the column address C_ADDR to the data input/output circuit 540.

The address decoder 520 may be connected to the memory cell array 510 through the string selection line SSL, the plurality of word lines WLs and the ground selection line GSL.

At the time of a writing operation or a reading operation, the address decoder 520 determines one of the plurality of word lines WLs as a selected word line on the basis of the row address R_ADDR provided from the control circuit 550, and determines the remaining word lines except the selected word line among the plurality of word lines WLs as non-selected word lines.

The address decoder 520 may receive word line voltages VWLs required for the operation of the first nonvolatile memory 221 from a voltage generator disposed inside or outside the first nonvolatile memory 221. The word line voltages VWLs may be applied to the plurality of word lines WLs via the address decoder 520.

The page buffer circuit 530 may be connected to the memory cell array 510 via a plurality of bit lines BLs.

The page buffer circuit 530 may include a plurality of page buffers. In an embodiment, one bit line is connected to one page buffer. In another embodiment, two or more bit lines is connected to one page buffer.

The page buffer circuit 530 may temporarily store the data to be written on the selected page at the time of the writing operation, and may temporarily store the data which is read from the selected page at the time of the reading operation.

The data input/output circuit 540 may be connected to the page buffer circuit 530 via a data line DL.

At the time of the writing operation, the data input/output circuit 540 receives the write data (DATA) from the solid state drive controller 20, and may provide the write data (DATA) to the page buffer circuit 530 on the basis of the column address C_ADDR provided from the control circuit 550.

At the time of the reading operation, the data input/output circuit 540 may provide read data (DATA) stored in the page buffer circuit 530 to the controller 530 on the basis of the column address C_ADDR provided from the control circuit 210.

An example of the plurality of nonvolatile memories 221 to 224 included in the open channel solid state drive 20 has been described above by referring to FIGS. 3 to 7, but embodiments of the inventive concept are not limited thereto, since each of a plurality nonvolatile memories 221 to 224 may be implemented in various forms.

Figure 8:
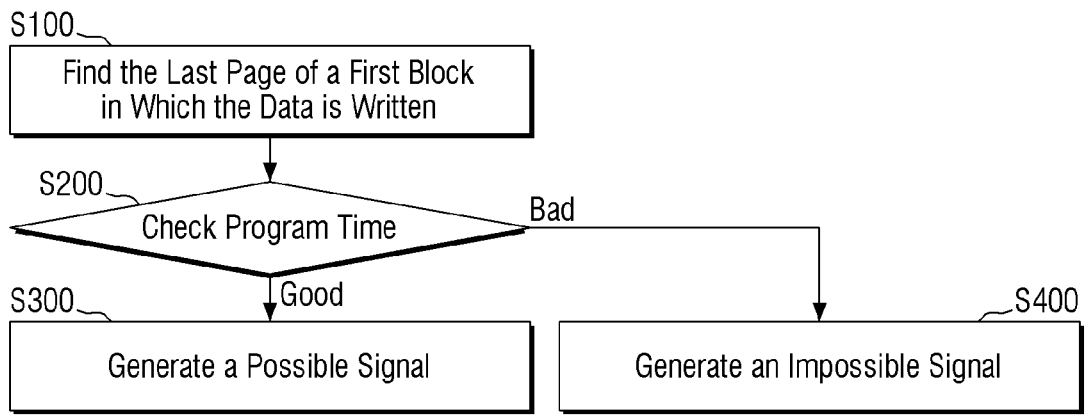
FIG. 8 is a flowchart for explaining an operation of a successive writing judgement module of FIG. 4 according to an exemplary embodiment of the present inventive concept.

FIG. 8 is a flowchart for explaining the operation of the successive writing judgment module of FIG. 4 according to an exemplary embodiment of the inventive concept.

Referring to FIGS. 4 and 8, the successive writing judgment module 215 searches for the last page on which the data is written in the first block (S100).

Here, the first block may mean a block in which data is written during the writing operation. Further, remaining data which is not written in the first block due to power-off among the data is defined as first data, and data already written in the first block is defined as second data.

The successive writing judgment module 215 may finally find the last page among the pages in which the data of the first block is written to check whether the successive writing is possible or impossible. For example, if the control circuit 550 had directed that 5 pages of data be written to a first memory block of the memory cell 510, and the power-off occurred after the control circuit 550 had successfully completed writing only 2 of the 5 pages to the first memory block, then the first 2 pages would be the second data, the last 3 pages would be the first data, and last page would be the second page.

Subsequently, the successive writing judgment module 215 checks the program time (S200).

Here, the program time may mean the time from the timing, at which the second data is programmed, that is, written in the last page among the pages in which the data of the first block is written, to the present timing. For example, if 5 pages were to be written, and only 2 pages of the 5 were written due to the power-off, the last page of the 2 pages was written at time 0, and it is currently time 5, then the program time would be 5.

The checking of the program time may include the successive writing judgment module 215 comparing the program time with a reference value. For example, the reference value may be a minimum reference value. That is, if the program time is larger than the minimum reference value, the successive writing judgment module 215 may judge that the successive writing is possible (Good), and if the program time is smaller than the minimum reference value, the successive writing judgment module 215 may judge that the successive writing is impossible (Bad).

Alternatively, the reference value may be the maximum reference value. That is, if the program time is smaller than the maximum reference value, the successive writing judgment module 215 may judge that the successive writing is possible (Good), and if the program time is larger than the maximum reference value, the successive writing judgment module 215 may judge that the successive writing is impossible (Bad).

Alternatively, the reference value may include both the minimum reference value and the maximum reference value. That is, if the program time is smaller than the maximum reference value and larger than the minimum reference value, the successive writing judgment module 215 may judge that the successive writing is possible (Good), and if the program time is larger than the maximum reference value or smaller than the minimum reference value, the successive writing judgment module 215 may judge that the successive writing is impossible (Bad).

Subsequently, when it is judged that writing is possible (Good), the successive writing judgment module 215 generates a possible signal (S300).

Subsequently, when it is judged that the successive writing is impossible (Bad), the successive writing judgement module 215 generates an impossible signal (S400).

Figure 9:
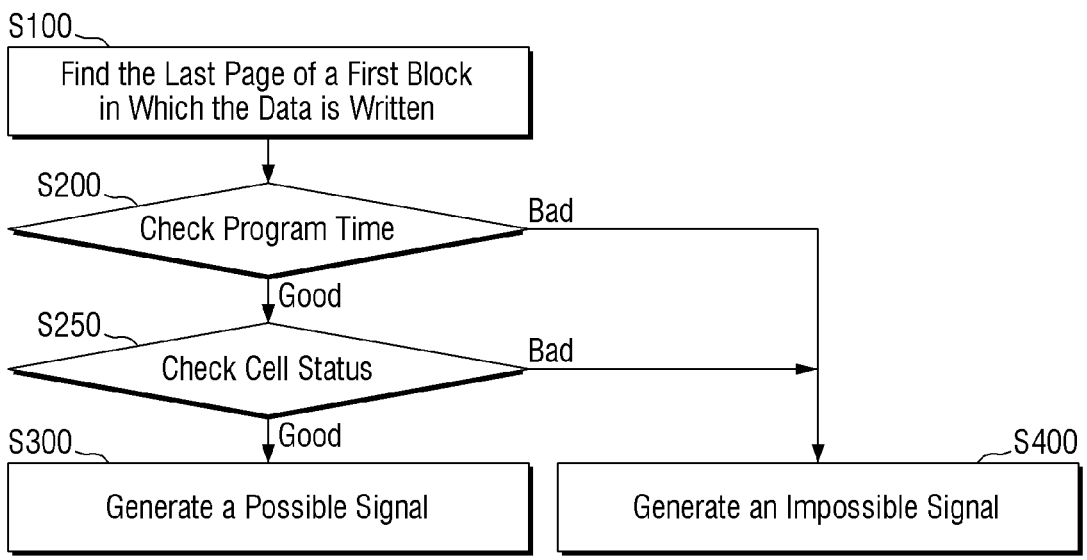
FIG. 9 is a flowchart for explaining the operation of the successive writing judgement module of the nonvolatile memory system according to an exemplary embodiment of the present inventive concept.

FIG. 9 is a flowchart for explaining the operation of the successive writing judgement module of a nonvolatile memory system according to an exemplary embodiment of the present inventive concept.

Referring to FIG. 9, since the method is the same as the method of FIG. 8 except for a step of checking the cell status (S250), repeated parts of the description of FIG. 8 will be simplified or omitted.

The successive writing judgment module 215 judges the program time (S200) and then checks the cell status (S250).

In an embodiment, the cell means a memory cell, and checking of the cell status means checking whether the cell status of the pages of the first block is good for the successive writing.

The successive writing judgment module 215 may determine the cell status of the first block in consideration of a program-erase (PE) cycle and/or a temperature. For example, the successive writing judgment module 215 may determine the cell status of the first block to be bad if the first block has already been programmed and/or erased more than a threshold number of times. For example, the successive writing judgment module 215 may determine the cell status of the first block to be bad if the temperature is greater than a threshold temperature. The successive writing judgement module 215 may judge that writing is possible (Good) if the cell status is good, and may judge that the successive writing is impossible (Bad) if the cell status is not good.

Although FIG. 9 illustrates that the program time is checked first (S200), and then the cell status is checked afterwards (S250), embodiments of the inventive concept are not limited thereto. That is, the order of a step (S200) of checking the program time and a step (S250) of checking the cell status may be swapped with each other, and the steps may be executed independently of each other.

Figure 10:
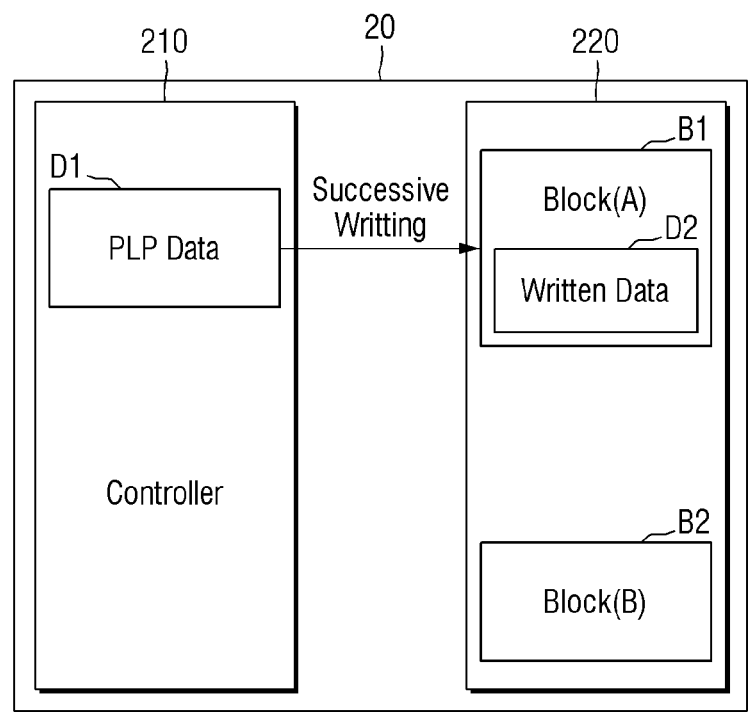
FIG. 10 is a block diagram for explaining the operation in a case where successive writing of the nonvolatile memory system according to an exemplary embodiment of the present inventive concept is possible.

FIG. 10 is a block diagram for explaining the operation in the case where successive writing of the nonvolatile memory system according to an exemplary embodiment of the present inventive concept is possible.

Referring to FIG. 10, the controller 210 may correspond to the controller 210 of FIG. 3, and the memory 220 may correspond to the memory 220 of FIG. 3.

The memory 220 includes a first block B1 and a second block B2 therein. The first block B1 may be a block in which the data (DATA) received from the host 10 of FIG. 1 is written by the writing operation. When a sudden power-off occurs during the writing operation, only a part of the data (DATA) of FIG. 1 is written in the first block B1 and the rest has not been written in the first block B1 yet.

In an exemplary embodiment, the controller 210 preserves the data which has not been written yet as the first data D1 via a power loss protection PLP function, using auxiliary power. For example, the controller 210 may continue to receive auxiliary power from an internal battery or capacitor within the drive 20 for a period of time after main power that is supplied to the drive 20 from an external source is lost. The controller 210 can use this period of time to preserve the remaining data that has not yet been written. Also, the data already written in the first block B1 among the data (DATA) of FIG. 1 may be referred to as the second data D2 in the first block B1. That is, the data (DATA) of FIG. 1 may be divided into the first data D1 and the second data D2.

Conversely to the first block B1, the second block B2 may be an empty block in which no data is written.

In an exemplary embodiment, when the successive writing judgement module 215 of FIG. 4 generates a possible signal, the controller 210 successively writes the first data D1 in the first block B1. In such a case, since the data (DATA) of FIG. 1 including the first data D1 and the second data D2 is entirely written in the first block B1 as intended by the host 10, power loss protection may be achieved.

Figure 11:
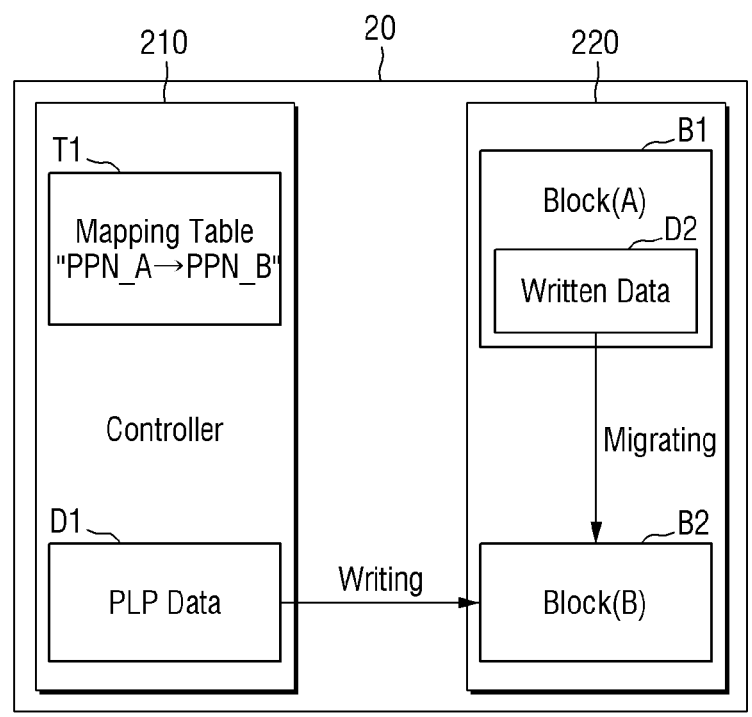
FIG. 11 is a block diagram for explaining the operation in a case where successive writing of the nonvolatile memory system according to an exemplary embodiment of the present inventive concept is impossible.

FIG. 11 is a block diagram for explaining the operation in the case where successive writing of the nonvolatile memory system according to an exemplary embodiment of the present inventive concept is impossible.

Referring to FIGS. 1 and 11, in an exemplary embodiment, when the successive writing judgement module 215 of FIG. 4 generates an impossible signal, the controller 210 writes the first data D1 in the empty second block B2 other than the first block B1. In a further embodiment, the controller 210 additionally moves the second data D2 present in the first block B1 to the second block B2.

In an embodiment, the moving of the second data D2 to the second block B2 retains a copy of the second data D2 in the first block B1. In another embodiment, the moving of the second data D2 to the second block B2 deletes the copy of the second data in the first block B1.

As a result, as the first data D1 and the second data D2 are shifted to the second block B2, respectively, the data (DATA) may be entirely written in the second block B2.

In this case, even though the host 10 intended to write the data (DATA) in the first block B1, the data (DATA) is actually written in the second block B2 by the power loss protection. Thus, the controller 210 may include a first mapping table T1 therein.

Mapping from the first physical page number (PPN_A) of the first block B1 to the second physical page number (PPN_B) of the second block B2 may be recorded in the first mapping table T1. The first mapping table T1 may be created by the controller 210. As a result, the command of the first block B1 specified by the host 10 later may be executed in the second block B2 by referring to the first mapping table T1. For example, if the host 10 desires to read from a given physical page number, the controller 210 can refer to the first mapping table T1 to determine if data associated with the given physical page number was moved to a new block due to a power failure. For example, if the first mapping table T1 indicates that the given physical page number is mapped to a new physical page number, the controller 210 can respond to the read with data from the new physical page number.

In the nonvolatile memory system according to the present embodiment, even when the power is suddenly turned off, it is possible to effectively preserve the data being written. Also, even if the flash translation layer 110 does not exist in the open channel solid state drive 20, it is possible to complete the writing operation of the data intended by the host 10 via the mapping between the physical addresses.

Hereinafter, a nonvolatile memory system according to an exemplary embodiment of the present inventive concept will be described with reference to FIG. 12. Repeated contents of the above-described embodiments will be simplified or omitted.

Figure 12:
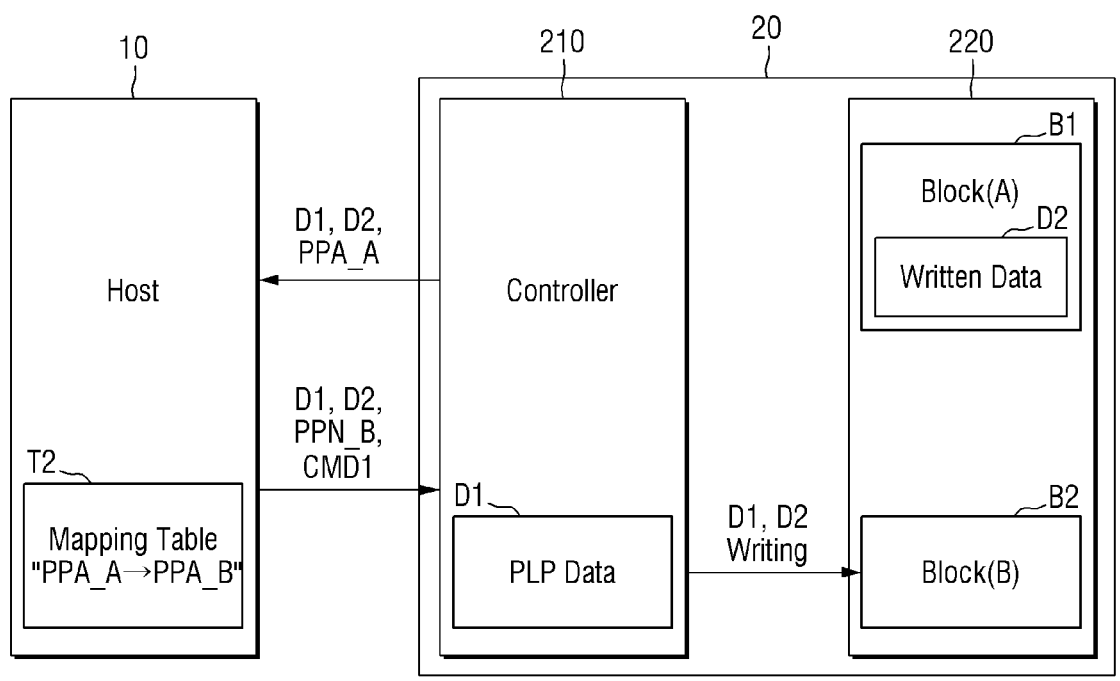
FIG. 12 is a block diagram for explaining the operation in a case where successive writing of the nonvolatile memory system according to an exemplary embodiment of the present inventive concept is impossible.

FIG. 12 is a block diagram for explaining an operation in a case where successive writing of a nonvolatile memory system according to an exemplary embodiment of the present inventive concept is impossible.

Referring to FIG. 12, when the successive writing judgement module 215 of FIG. 4 generates the impossible signal, the host 10 of the nonvolatile memory system according to an embodiment of the present inventive concept receives the first data D1 and the second data D2 from the controller 210. Also, the host 10 may also receive the first physical page address (PPA_A) of the first block B1.

The host 10 may directly transmit the second physical page number (PPN_B) of the second block B2, the first command (CMD1), the first data D1, and the second data D2 to the controller 210. The first command (CMD1) may be a command to write the first data D1 and the second data D2 in the second block B2. That is, the host 10 may directly participate in the writing of the first data D1 and the second data D2. Thus, the host 10 may include a second mapping table T2 therein.

Mapping from the first physical page address (PPA_A) of the first block B1 to the second physical page address (PPA_B) of the second block B2 may be recorded in the second mapping table T2. The second mapping table T2 may be created directly by the host 10. As a result, the host 10 may transmit a command to the controller 210 to access the second block B2 later with reference to the second mapping table T2 instead of the command to access the first block B1.

In the nonvolatile memory system according to the present embodiment, since the host 10 may directly manage the data, the efficiency of the memory operation increases, and intuitive data management may be possible. Furthermore, it is possible to completely execute the power loss protection function only with the existing write command without necessity of a new command.

Hereinafter, a nonvolatile memory system according to an exemplary embodiment of the present inventive concept will be described with reference to FIG. 13. Repeated contents of the above-described embodiments will be simplified or omitted.

Figure 13:
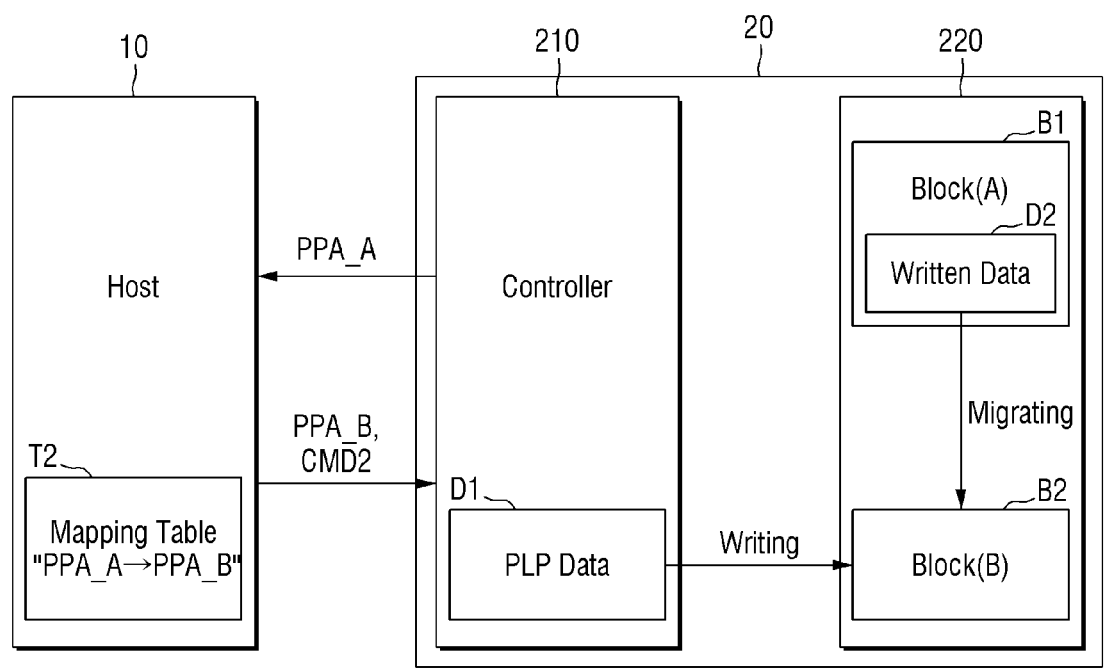
FIG. 13 is a block diagram for explaining the operation in the case where successive writing of the nonvolatile memory system according to an exemplary embodiment of the present inventive concept is impossible.

FIG. 13 is a block diagram for explaining the operation in the case where successive writing of the nonvolatile memory system according to an exemplary embodiment of the present inventive concept is impossible.

Referring to FIG. 13, when the successive writing judgement module 215 of FIG. 4 generates an impossible signal, the host 10 of the nonvolatile memory system according to an exemplary embodiment of the present inventive concept receives the first physical page address (PPA_A) of the first block B1 from the controller 210.

Subsequently, the host 10 directly transmits the second physical page number (PPN_B) and the second command (CMD2) of the second block B2 to the controller 210. The second command (CMD2) may be a command to write the first data D1 in the second block B2 and to move the second data D2 from the first block B1 to the second block B2.

That is, instead of directly receiving and transmitting the first data D1 and the second data D2, the host 10 may transmit the command to write the first data D1 and the second data D2 in the second block B2 to the controller 210. The host 10 may create the second mapping table T2, while transmitting the second command (CMD2).

The controller 210 writes the first data D1 in the second block B2 and moves the second data D2 from the first block B1 to the block B2 in response to the second command (CMD2).

The host 10 may include a second mapping table T2 therein. The mapping from the first physical page address (PPA_A) of the first block B1 to the second physical page address (PPA_B) of the second block B2 may be recorded in the second mapping table T2. The second mapping table T2 may be directly created by the host 10. As a result, the host 10 may transmit a command of the second block B2 to the controller 210 later with reference to the second mapping table T2 instead of the command of the first block B1.

In the nonvolatile memory system according to the present embodiment, since the host 10 may directly manage the data, the efficiency of the memory operation increases, and objective data management may be possible. Furthermore, since the power loss protection function may be executed inside the open channel solid state drive 20 without transmission of data, overhead of data transmission may be reduced.

Hereinafter, a nonvolatile memory system according to an exemplary embodiment of the present inventive concept will be described with reference to FIGS. 14 to 16. Repeated contents of the above-described embodiments will be simplified or omitted.

Figure 14:
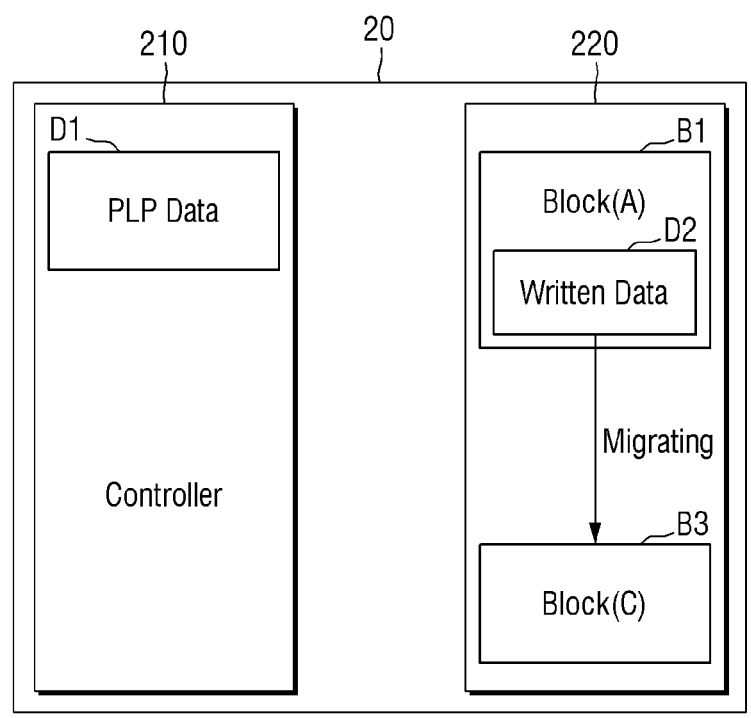
FIGS. 14 to 16 are intermediate stage diagrams for explaining the operation in the case where successive writing of the nonvolatile memory system according to some embodiments of the present inventive concept is impossible.
Figure 15:
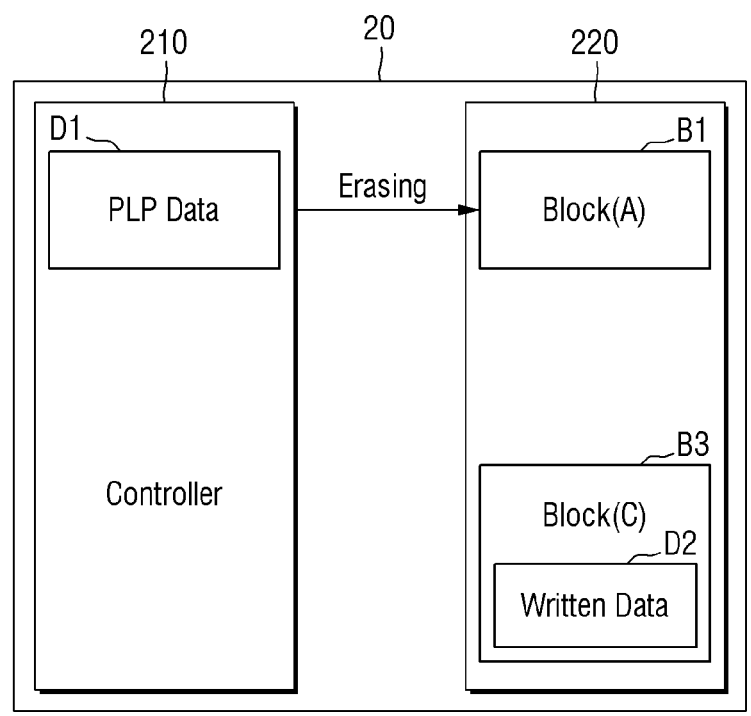
Figure 16:
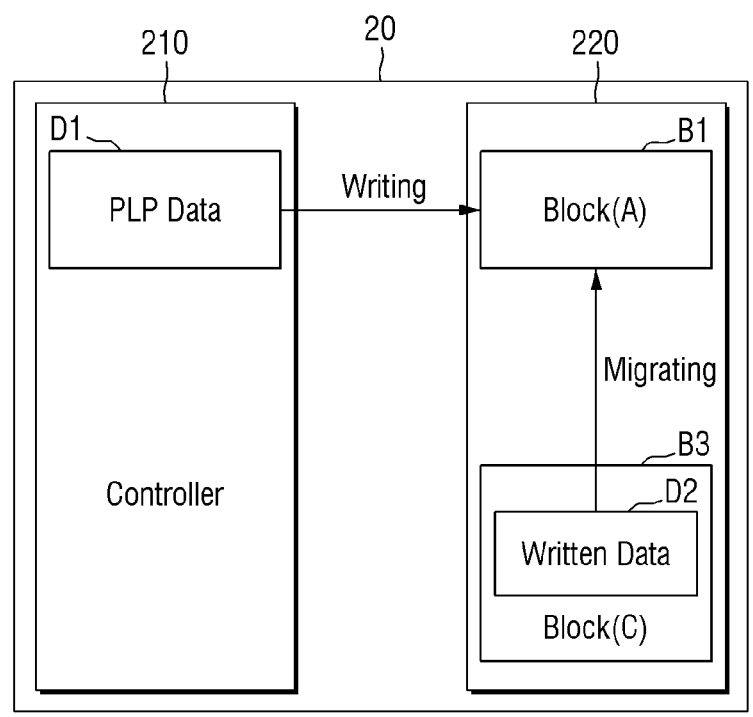

FIGS. 14 to 16 are diagrams of intermediate stages for explaining the operation in the case where successive writing of the nonvolatile memory system according to an exemplary embodiment of the present inventive concept is impossible.

Referring to FIG. 14, when the successive writing judgement module 215 of FIG. 4 generates an impossible signal, the controller 210 moves the second data D2 to the empty third block B3 other than the first block B1. At this time, the third block B3 may be temporarily used as an empty block in the memory 220.

Therefore, the second data D2 is located in the third block B3, and the second data D2 may exist also in the first block B1.

Subsequently, referring to FIG. 15, the controller 210 erases the second data D2 located in the first block B1. Accordingly, the first block B1 may become an empty block. The second data D2 remains as it is in the third block B3.

Next, referring to FIG. 16, the controller 210 writes the first data D1 in the first block B1 and moves the second data D2 from the third block B3 to the first block B1. As a result, since the data (DATA) of FIG. 1 including the first data D1 and the second data D2 is entirely written in the first block B1 intended by the host 10, power loss protection may be achieved.

That is, since the entire data (DATA) of FIG. 1 is written in the existing first block B1, mapping in the open channel solid state drive 20 is not required, and the mapping in the host 10 is also not required.

Thus, in at least one embodiment of the present inventive concept, despite a sudden power-off, it is possible to write the desired data in a block desired by the host 10 without any additional address mapping.

In concluding the detailed description, those skilled in the art will appreciate that many variations and modifications may be made to the these exemplary embodiments without substantially departing from the principles of the present inventive concept.

What is claimed is:

1. A solid state drive (SSD) comprising:
a memory including a plurality of nonvolatile memories, each of the plurality of nonvolatile memories including a memory cell array that includes a plurality of memory blocks including a first memory block and a second memory block, each of the plurality of memory blocks including a plurality of memory cells; and
a controller configured to control the memory, to receive first data and a first address from an external device, and to perform a first write operation with the first data on the first memory block that the first address specifies, such that during the first write operation, a first portion of the first data is written in the first memory block and a second portion of the first data is not written in the first memory block,
wherein the controller is configured to compare a program time of the first portion of the first data in the first memory block with a reference value and perform one of i) a second write operation with the first data on the second memory block and ii) a third write operation with the second portion of the first data on the first memory block, based on a result of the compare.

2. The SSD of claim 1, wherein the controller is configured to receive a second address that specifies the second memory block from the external device to perform the second write operation on the second memory block.

3. The SSD of claim 2, wherein the controller receives the first data again from the external device when the controller receives the second address from the external device.

4. The SSD of claim 2, wherein the controller does not receive the first data again from the external device when the controller receives the second address from the external device.

5. The SSD of claim 1, wherein the controller includes a mapping table including mapping information from the first address to a second address that specifies the second memory block.

6. The SSD of claim 1, wherein the controller erases the first portion of the first data stored in the first memory block.

7. The SSD of claim 1, further comprising a buffer configured to temporarily store the first data.

8. A solid state drive (SSD) comprising:
a memory including a plurality of nonvolatile memories, each of the plurality of nonvolatile memories including a memory cell array that includes a plurality of memory blocks including a first memory block and a second memory block, each of the plurality of memory blocks including a plurality of memory cells; and
a controller configured to control the memory, to receive first data and a first address from an external device, and to perform a first write operation with the first data on the first memory block that the first address specifies, such that during the first write operation, a first portion of the first data is written in the first memory block and a second portion of the first data is not written in the first memory block,
wherein the controller is configured to perform a second write operation to write the first data to the second memory block by outputting the second portion of the first data from the controller to the second memory block, and by outputting the first portion of the first data from the first memory block to the second memory block.

9. The SSD of claim 8, wherein the controller receives a second address that specifies the second memory block from the external device.

10. The SSD of claim 9, wherein the controller does not receive the first data again from the external device when the controller receives the second address from the external device.

11. The SSD of claim 8, wherein the controller includes a mapping table including mapping information from the first address to a second address that specifies the second memory block.

12. The SSD of claim 8, further comprising a buffer configured to temporarily store the first data.

13. The SSD of claim 8, wherein when the controller moves the first portion of the first data from the first memory block to the second memory block, the first portion of the first data is deleted from the first memory block.

14. The SSD of claim 8, wherein the controller performs the second write operation based on comparison of a program time of the first portion of the first data in the first memory block with a reference value.

15. The SSD of claim 8, wherein the controller performs the second write operation based on comparison of a temperature of the first memory block with a threshold temperature.

16. The SSD of claim 8, wherein the controller performs the second write operation based on comparison of a program/erase count of the first memory block and a threshold count.

* * * * *